United States Patent
Yang et al.

(10) Patent No.: US 7,655,949 B2
(45) Date of Patent: Feb. 2, 2010

(54) THIN FILM TRANSISTOR SUBSTRATE HAVING STRUCTURE FOR COMPENSATING FOR MASK MISALIGNMENT

(75) Inventors: Sung-hoon Yang, Yongin-si (KR);
So-woon Kim, Suwon-si (KR);
Tae-hyung Hwang, Seoul (KR);
Yeon-joo Kim, Suwon-si (KR);
Soo-wan Yoon, Suwon-si (KR);
Chong-chul Chai, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 122 days.

(21) Appl. No.: 11/859,203

(22) Filed: Sep. 21, 2007

(65) Prior Publication Data
US 2008/0078992 A1 Apr. 3, 2008

(30) Foreign Application Priority Data
Oct. 2, 2006 (KR) ............... 10-2006-0097144

(51) Int. Cl.
*H01L 27/14* (2006.01)
(52) U.S. Cl. ............... 257/59; 257/72; 257/E27.131; 257/E29.117; 349/43; 349/46
(58) Field of Classification Search ............... 257/202, 257/59, 72, E27.131, E29.117; 349/43, 46
See application file for complete search history.

(56) References Cited

U.S. PATENT DOCUMENTS

| 5,097,297 A * | 3/1992 | Nakazawa | 257/347 |
| 2005/0208693 A1 * | 9/2005 | Youn et al. | 438/30 |
| 2006/0132461 A1 * | 6/2006 | Furukawa et al. | 345/173 |
| 2006/0145154 A1 * | 7/2006 | Choi et al. | 257/57 |
| 2007/0132902 A1 * | 6/2007 | Yao | 349/43 |

FOREIGN PATENT DOCUMENTS

| JP | 1-267617 | 10/1989 |
| JP | 2-285326 | 11/1990 |
| KR | 2001-0003742 | 1/2001 |

\* cited by examiner

*Primary Examiner*—Minh-Loan T Tran
(74) *Attorney, Agent, or Firm*—Innovation Counsel LLP

(57) ABSTRACT

A thin film transistors (TFTs) substrate is structured to maintain as constant across the area of the substrate a kickback voltage due to Miller capacitance between the drain and gate of each TFT even in the presence of manufacturing induced misalignments between the drain electrodes and corresponding gate lines. Each thin film transistor includes a gate electrode, an active layer formed on the gate electrode so as to overlap the gate electrode, first and second source electrodes respectively connected to first and second data lines each of which crosses the gate line while being insulated from the gate line, and an elongated drain electrode located between the first and second source electrodes and disposed over the gate electrode so as to a crossing length of the drain electrode is larger than an underlying width of the gate electrode such that misalignment induced shifts of the position of the gate electrode relative to the drain electrode does not substantially change overlap area between the two.

20 Claims, 10 Drawing Sheets

THIN FILM TRANSISTOR SUBSTRATE HAVING STRUCTURE FOR COMPENSATING FOR MASK MISALIGNMENT

CROSS REFERENCE TO RELATED APPLICATION

This application claims priority from Korean Patent Application No. 10-2006-0097144 filed on Oct. 2, 2006 in the Korean Intellectual Property Office, the disclosure of which is incorporated herein by reference in its entirety.

BACKGROUND

1. Field of Invention

The present disclosure of invention relates to a thin film transistor (TFT) substrate, and more particularly, to a thin film transistor substrate such as may be used in flat panel display applications and is capable of providing improved image quality in an image display device by maintaining a substantially constant drain-to-gate feedback capacitance even in the presence of mask misalignment.

2. Description of Related Art

Generally, flat panel image display devices include a thin film transistor (TFT) array formed on a transparent substrate that has interconnect electrodes provided thereon. Such flat panel devices display a predetermined but changeable (i.e., moving) image by applying corresponding voltages to different electrodes of the substrate. Examples of the image display device may include liquid crystal displays (LCDs), electronic paper displays (EPDs), and the like.

The thin film transistor (TFT) substrate typically includes a plurality of gate lines, data lines, pixel electrodes, and the like interconnected with a distributed array of field effect transistors.

A typical thin film transistor is a three-terminal electronic element that has a control terminal (gate electrode) connected to one of the gate lines, an input terminal (source electrode) connected to one of the data lines, and an output terminal (drain electrode) connected to one of the pixel electrodes.

Slight misalignments of masking steps during mass production can lead to variances across the substrate of an overlapping area that is usually present between the gate electrode and the drain electrode of each respective pixel area. This overlap corresponds to a drain-to-gate parasitic capacitance that is sometimes referred to as a Miller capacitance. When a fast rising voltage pulse is applied between the gate and source of a TFT that has inherent Miller capacitance, a negative feedback voltage results (which feedback may also be called a kickback signal). If Miller capacitance varies between pixel areas in a liquid crystal panel due to mask misalignment, it can result in uneven response to similar gate pulsing signals due to the across-the-substrate differences in kickback voltages among the various pixels. Such uneven response can create undesirable visual artifacts. As such, in the presence of mask misalignment, it is desirable to find a way to nonetheless maintain consistent, across-the panel image quality.

SUMMARY

Exemplary embodiments in accordance with the present disclosure of invention provide a thin film transistor substrate that is capable of maintaining a substantially constant kickback voltage effect across the substrate even in the presence of mask misalignment.

According to an exemplary embodiment, there is provided a thin film transistor substrate including an insulating substrate, gate lines, each of which is formed on the insulating substrate and includes or connects to a gate electrode, an active layer formed on the gate electrodes so as to overlap the gate electrodes, first and second data lines, each of which crosses the gate lines while being insulated from the gate lines, first and second source electrodes branched from the first and second data lines, respectively, and overlapping the active layer, and drain electrodes, each of which is located between the first source electrode and the second source electrode, where the drain electrode is formed on the gate electrode so as to have a length larger than the overlapping width of the gate electrode so that the drain electrode more than fully overlaps the gate electrode so as to maintain a constant overlap area even if the gate electrode hypothetically shifts along the longitudinal direction of the drain electrode.

According to another exemplary embodiment, there is a provided a thin film transistor substrate including an insulating substrate formed of plastic, gate lines, each of which is formed on the insulating substrate and comprises or connects to a gate electrode, an active layer formed on the gate electrodes so as to overlap the gate electrodes, and made of an organic material, first and second data lines, each of which crosses the gate line while being insulated from the gate line, first and second source electrodes branched from the first and second data lines, and overlapping the active layer, and drain electrodes, each of which is located between the first source electrode and the second source electrode, and is formed on the gate electrode so as to have a length larger than the overlapping width of the gate electrode so that the drain electrode more than fully overlaps the gate electrode so as to maintain a constant overlap area even if the gate electrode hypothetically shifts along the longitudinal direction of the drain electrode, and is substantially perpendicular to the gate line.

BRIEF DESCRIPTION OF THE DRAWINGS

The above and other aspects and features of the present disclosure will become more apparent by describing in detail exemplary embodiments thereof with reference to the attached drawings in which:

FIG. 2B is a cross-sectional view of the thin film transistor substrate shown of FIG. 1 taken along the line B-B' in;

DETAILED DESCRIPTION

Figure 1:
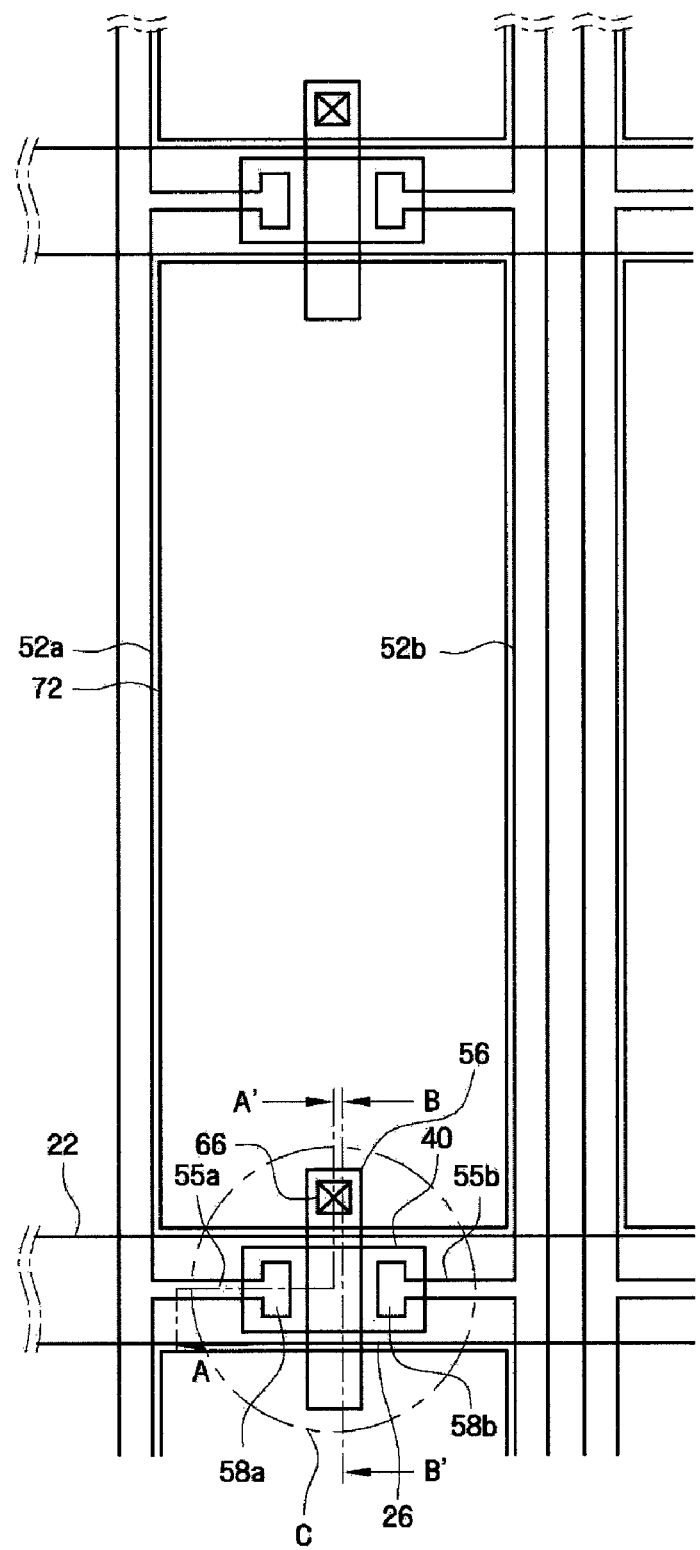
FIG. 1 is a layout view of a thin film transistor substrate according to a first exemplary embodiment.

Advantages and features of the present disclosure and methods of accomplishing the same may be understood more readily by reference to the following detailed description of exemplary embodiments and the accompanying drawings. The exemplary embodiments provided herein are to be taken as nonlimiting. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout the specification.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

A thin film transistor substrate according to the following exemplary embodiments may be used for a variety of image display devices including flat panel displays that include thin film transistors (TFTs) or other field effect switching elements. However, for the convenience of explanation, a liquid crystal display will be described as an example of an image display device that uses the thin film transistor substrate according to the exemplary embodiments. Here, the liquid crystal display includes a thin film transistor substrate on which a thin film transistor array is formed, a common electrode containing substrate that is disposed to face the thin film transistor substrate where the common electrode containing substrate has a common electrode formed thereon, and a liquid crystal material layer interposed between the substrates.

Figure 2A:
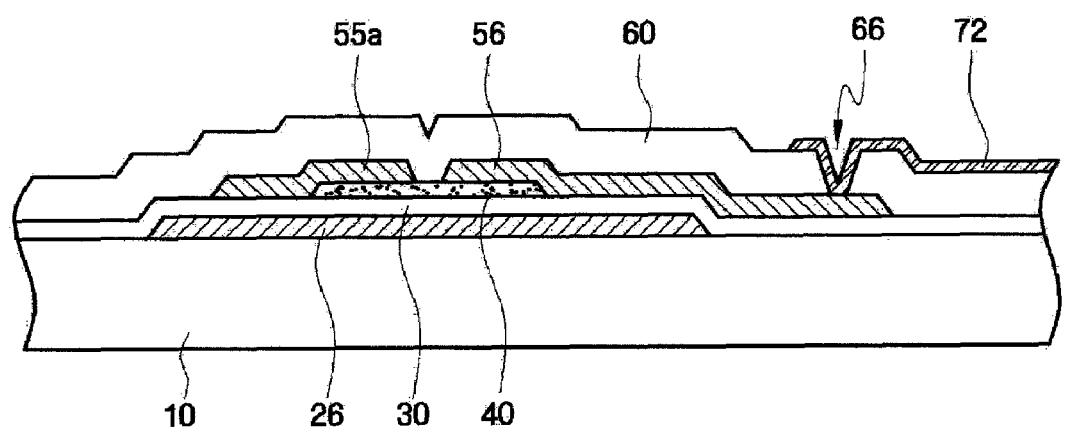
FIG. 2A is a cross-sectional view of the thin film transistor substrate shown of FIG. 1 taken along the line A-A'.
Figure 2B:
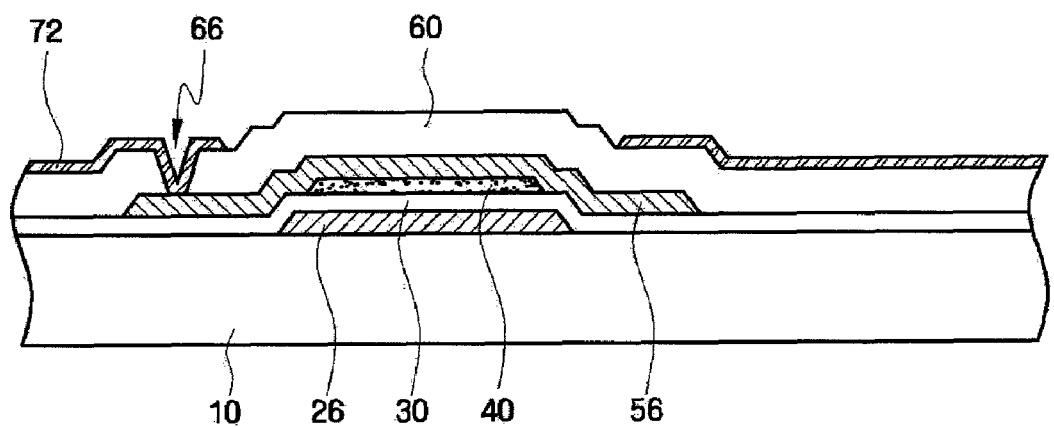
Figure 3A:
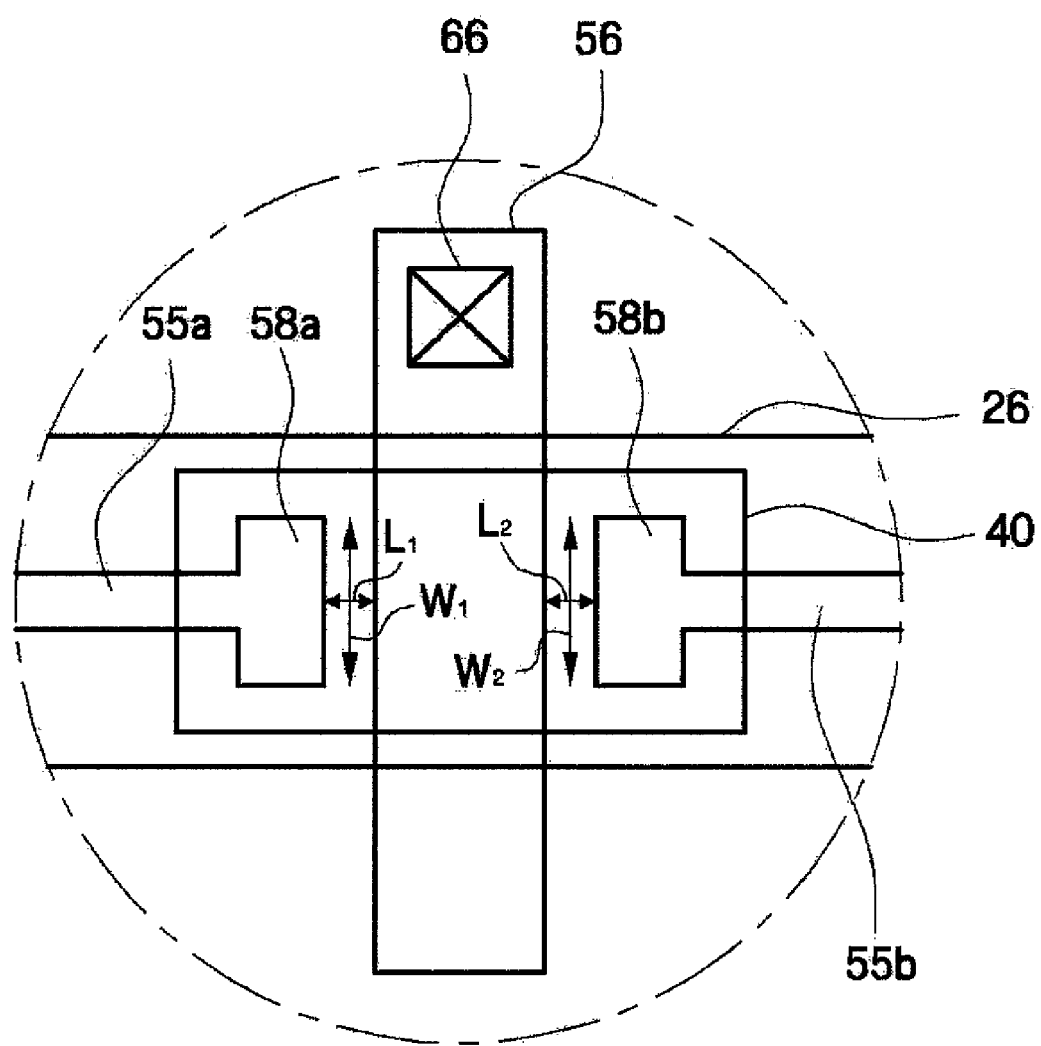
FIG. 3A is an enlarged view illustrating a portion "C" of FIG. 1.
Figure 3B:
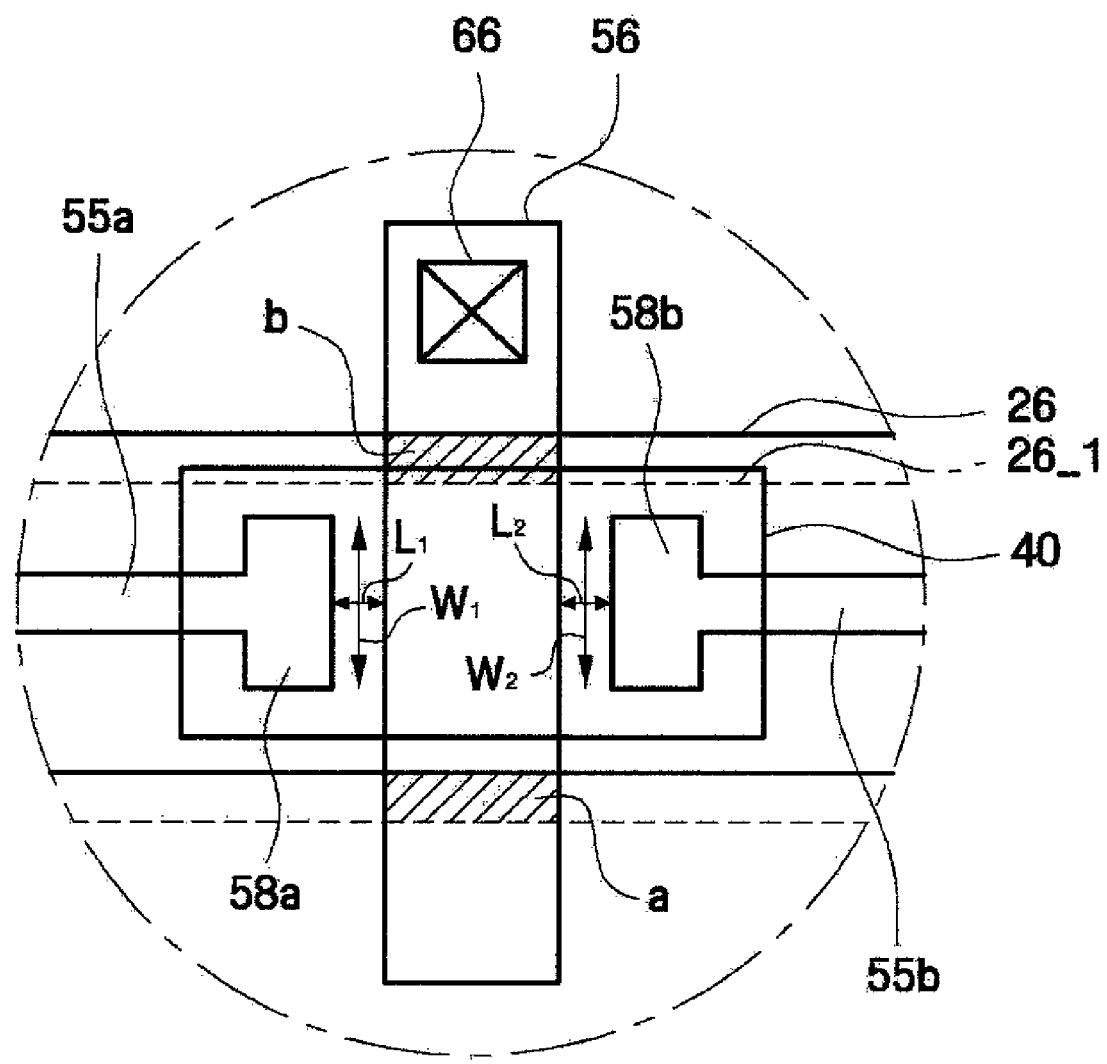
FIG. 3B is an enlarged view illustrating a portion "C" of FIG. 1 when mask misalignment occurs.

Referring to FIGS. 1 to 3B, a thin film transistor substrate according to a first exemplary embodiment will be described in detail. FIG. 1 is a layout view of such a thin film transistor substrate 100. FIG. 2A is a cross-sectional view of the substrate of FIG. 1 taken along the line A-A'. FIG. 2B is a cross-sectional view of the substrate of FIG. 1 taken along the line B-B'. FIG. 3A is an enlarged view illustrating a portion "C" of FIG. 1. FIG. 3B is an enlarged view illustrating a portion "C" of FIG. 1 when mask misalignment occurs.

Referring to FIGS. 1 to 2B, the illustrated thin film transistor substrate 100 includes gate lines 22 that are formed on an insulating substrate 10, first and second data lines 52a and 52b, first and second source electrodes 55a and 55b, drain electrodes 56, and pixel electrodes 72, and the like.

The insulating substrate 10 may be formed of an optically transmissive material that has thermal resistance, such as glass or plastic. In particular, since plastic is very easy to process and it is light, cheap, and flexible, the plastic is often used for the insulating substrate 10.

The plastic that is used for the insulating substrate 10 may be plastic that has excellent thermal resistance so as to withstand temperature necessary to manufacture the thin film transistor substrate 100. For example, the plastic may be a high-molecular material, such as PES (polyethersulphone), PAR (polyacrylate), PEI (polyetherimide), PEN (polyethylenenaphthalate), PET (polyethyeleneterepthalate), or the like.

The gate line 22 that includes a gate electrode 26 is formed on the insulating electrode 10. The gate line 22 generally extends in a horizontal direction and transmits a gate signal.

Here, the gate line 22 may be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), titanium (Ti), or tantalum (Ta). Further, the gate line 22 may have a multilayer structure that includes two conductive layers (not shown) having different physical properties.

Meanwhile, the gate line 22 may be formed by applying PEDOT (polyethylenedioxythiophene), which is a conductive organic polymer-based material, by a coating method, or printing the PEDOT by an inject-printing method.

A portion of the gate line 22 serves as the gate electrode 26 of its respective TFT. The portion of the gate line 22 serving as the gate electrode 26, and a first source electrode 55a, a second source electrode 55b, and a drain electrode 56, which are described in detail below, form three terminals of the thin film transistor. Also, the gate line 22 may include a separate gate electrode 26 that is formed by partially increasing the width of the gate line 22. As such, when the separate gate electrode 26 is formed, the semiconductive material of the thin film transistor is disposed on the gate electrode 26. As described above, the gate electrode 26 may protrude from the gate line 22. However, in this exemplary embodiment, the description will be made of a case where a portion of the gate line 22 is used as the gate electrode 26.

First, after a metal layer (not shown) that is used for the gate line 22 is laminated on the insulating substrate 10, the metal layer is patterned using a first mask so as to form the gate line 22. However, since the gate line 22 is generally of a relatively narrow width, the up and down position of the gate line 22 may vary slightly between different pixel areas of the substrate due to mask misalignment such as when a relatively small reticle is step-wise used across a substantially much larger substrate area. In particular, when a plastic substrate is used as the insulating substrate 10, the position of the gate line 22 is much more likely to be changed for each of the pixels because the plastic may expand and contract due to changes in process heat during lithographic formation. A parasitic capacitance related to this will be described in detail below.

Meanwhile, a storage electrode (not shown) may be disposed on the same layer as the gate line 22 and separated from the gate line 22 according to an independent wiring method. Without disposing the separate storage electrode, a storage capacitor may be formed by overlapping the gate line 22 and the pixel electrode 72 according to a storage electrode on gate method. Hereinafter, for the convenience of explanation, the description will be made as to the independent wiring method.

Above the insulating substrate 10, a gate insulating layer 30 that is formed of an inorganic insulating material, such as a silicon oxide (SiOx) or a silicon nitride (SiNx), or an organic insulating material, such as BCB (benzocyclobutene), an acryl-based material, or polyimide, covers the gate line 22. However, when an active layer 40 to be described below is formed of an organic material, it is generally the case that the gate insulating layer 30 is formed of the organic insulating material rather than the inorganic insulating material so as to improve an adhesion characteristic between the gate insulating layer 30 and the active layer 40.

The active layer 40 that is formed of hydrogenated amorphous silicon, polysilicon, a conductive organic material, or the like is formed on a portion of the gate insulating layer 30.

The organic material that is used for the active layer 40 may be selected from, for example, pentacene, tetracene, anthracene, naphthalene, α-6-thiophene, perylene and derivatives thereof, rubrene and derivatives thereof, coronene and derivatives thereof, perylenetetracarboxylic diimide and derivatives thereof, perylene tetracarboxylic dianhydride and derivatives thereof, polythiophene and derivatives thereof, polyparaperylenevinylene and derivatives thereof, polyfluorene and derivatives thereof, and polythiophene vinylene and derivatives thereof.

The active layer 40 may be formed in an island shape. The active layer 40 overlaps the gate electrode 26 on the gate line 22, and overlaps at least portions of the drain electrode 56, and the first source electrode 55a, and the second source electrode 55b that are described below. The shape of the active layer 40 is not limited to the island shape, but various modifications may be made thereto.

An ohmic contact layer (not shown), which is made of a material, such as n+ hydrogenated amorphous silicon doped with a silicide or n-type impurities at a high concentration, or an ITO doped with p-type impurities, may be formed on the active layer 40. The pair of ohmic contact layers are located on the active layer 40, and improve a contact characteristic between the active layer 40, and the drain electrode 56, the first source electrode 55a, and the second source electrode 55b, which are described below. When the contact characteristic between the active layer 40, and the drain electrode 56, the first source electrode 55a, and the second source electrode 55b, which are formed on the active layer 40, is sufficient, the ohmic contact layers may be omitted.

Data wiring lines 52a, 52b, 55a, 55b, 56, 58a, and 58b are formed on the active layer 40 and the gate insulating layer 30. The data wiring lines 52a, 52b, 55a, 55b, 56, 58a, and 58b includes the first data line 52a and the second data line 52b that are generally formed in a the vertical direction and define the pixels by crossing the gate lines 22 while being insulated, the first source electrode 55a and the second source electrode 55b that are branched from the first data line 52a and the second data line 52b, respectively, and extend to the active layer 40, the drain electrode 56 that is separated from the first source electrode 55a and the second source electrode 55b, and faces the first source electrode 55a and the second source electrode 55b with the gate line 22 therebetween, and parallel portions 58a and 58b that are formed at ends of the first source electrode 55a and the second source electrode 55b.

The data wiring lines 52a, 52b, 55a, 55b, 56, 58a, and 58b may be formed of a refractory metal, such as chromium, a molybdenum-based metal, tantalum, titanium, or the like. Further, the data wiring line 52a, 52b, 55a, 55b, 56, 58a, and 58b may have a multilayer structure including a lower layer (not shown), which is formed of the refractory metal or the like, and an upper layer (not shown), which is formed of a low-resistivity material and located on the lower layer.

The first data line 52a and the second data line 52b receive data signals from an external circuit, and transmit the data signals to the first source electrode 55a and the second source electrode 55b.

In one pixel area, the first and second data lines 52a and 52b as one pair are respectively disposed to extend along both longitudinal sides of the pixel electrode 72 to be described below, and substantially the same data voltage is applied to each of the first data line 52a and the second data line 52b for charging a corresponding pixel-electrode 72 via its TFT.

The first source electrode 55a and the second source electrode 55b that are branched from the first data line 52a and the second data line 52b, respectively, are disposed at both sides of the drain electrode 56, and face the drain electrode 56 while being spaced apart from the drain electrode 56. Here, the first source electrode 55a and the second source electrode 55b are spaced apart from each other.

The end of the first source electrode 55a and the end of the second source electrode 55b include the parallel or hammerhead-like portions 58a and 58b, respectively, which extend longitudinally in parallel to the longitudinal sides of the drain electrode 56 to be described below. The parallel portions 58a and 58b increase the effective channel widths $W_1$ and $W_2$ of the thin film transistor on the respective left and right sides of the drain electrode. Since the parallel portions 58a and 58b extend symmetrically from the nominal center longitudinal axis of the gate line 22 to substantially (although not fully) overlap the width of the gate electrode 26, the effective channel widths $W_1$ and $W_2$ of the thin film transistor are large and constant even when some amount of mask misalignment occurs so as to place the parallel portions 58a and 58b slightly off-center relative to the nominal center longitudinal axis of the gate line 22. In order to increase the channel widths $W_1$ and $W_2$ of the thin film transistor, the first source electrode 55a and the second source electrode 55b may be T-shaped as shown so as to form the portions in parallel to the longitudinal sides of the drain electrode 56.

Specifically, referring to FIG. 3A, the channel widths $W_1$ and $W_2$ that correspond to the widths of the first source electrode 55a and the second source electrode 55b are formed on the active layer 40. Further, the channel lengths $L_1$ and $L_2$ that correspond to distances at which the first source electrode 55a and the second source electrode 55b are respectively spaced-apart laterally from the drain electrode 56 so as to define the channel regions on the active layer 40. Current flow is generally a function of channel width over channel length (W/L). Thus, the larger the sum of the channel widths $W_1$ and $W_2$ with respect to the channel lengths $L_1$ and $L_2$ is, the larger will be the amount of current that flows through the thin film transistor when the transistor is switched on.

In this exemplary embodiment, the first source electrode 55a and the second source electrode 55b may be completely overlapped by the gate line 22. Further, the first source electrode 55a and the second source electrode 55b may just partially overlap the active layer 40.

In the thin film transistor substrate 100 of this exemplary embodiment, the one pair of the first data line 52a and the second data line 52b that transmit the same data voltage, and the first source electrode 55a and the second source electrode 55b are disposed in each pixel. Therefore, even when one of the one pair of the first data line 52a and the second data line 52b, or one of the first source electrode 55a and the second source electrode 55b is disconnected due to a defect, for example, even when the second data line 52b or the second source electrode 55b is disconnected, the desired data voltage can be applied to the pixel electrode 72. Therefore, it is possible to prevent defects from interfering with operation across the entire liquid crystal panel.

The drain electrode 56 is formed on the same layer as the first data line 52a and the second data line 52b, and has the length larger than the width of the gate electrode 26. Therefore, the drain electrode 56 overlaps the gate electrode 26 so as to completely cover the width of the gate electrode 26 and symmetrically extend beyond it. That is, the drain electrode 56 of this exemplary embodiment is formed in the vertical direction so as to be substantially perpendicular to the gate electrode 26 that is formed in the horizontal direction. To this end, the drain electrode 56 may be formed in a bar shape, for example. Accordingly, even when the up and down position of the gate electrode 26 may vary between the pixels due to mask misalignment, and particularly, the mask misalignment in the up and down direction, an overlapping area between the gate electrode 26 and the drain electrode 56 is constant. Therefore, the parasitic capacitance (Miller capacitance) remains substantially constant irrespective of such mask misalignment as will be described in further detail below.

The drain electrode 56 at least partially overlaps the active layer 40, and is electrically connected to the pixel electrode 72 through a contact hole 66.

The thin film transistor is the three-terminal element that includes the gate electrode 26, the first source electrode 55a and the second source electrode 55b that are connected to the first data line 52a and the second data line 52b, respectively, and the drain electrode 56 that is spaced apart from the first source electrode 55a and the second source electrode 55b.

When the gate voltage that is applied to the gate line 22 is larger than a threshold voltage ($V_t$), a conductive channel is formed in the active layer 40 and current can flow through. When the conductive channel is formed, the data voltage that is applied to the first data line 52a and the second data line 52b passes through the first source electrode 55a and the second source electrode 55b, the active layer 40, and the drain electrode 56, and is then transmitted to the pixel electrode 72 to thereby charge (or discharge) the pixel-electrode to the desired voltage.

Intentional and unintentional capacitors are formed at portions where the respective electrodes overlap each other. For example, a liquid crystal capacitor ($C_{LC}$) is formed by the dielectric material in the liquid crystal layer disposed between the pixel electrode 72 and the common electrode (not shown) of the common electrode substrate (not shown). A charge storage capacitor ($C_{st}$) is formed between the storage electrode and the pixel electrode 72. A parasitic capacitance (Miller capacitance) is formed between the gate electrode 26 and the drain electrode 56.

The driving of the liquid crystal panel will be described. After the thin film transistor is turned on by applying a turn-on voltage to the gate line 22, the data voltage representing an image signal is applied to the first source electrode 55a and the second source electrode 55b. The data voltage is transmitted to the pixel electrode 72 through the drain electrode 56. The data voltage is applied to the liquid crystal capacitor and the storage capacitor through the pixel electrode 72, and an electric field is formed due to a potential difference between the pixel electrode 72 and the common electrode.

Meanwhile, the data voltage, which is applied to the pixel electrode 72 when the thin film transistor is turned on, should be kept maintained even after the thin film transistor is turned off. However, the voltage applied to the pixel electrode 72 can become distorted, that is, the drain voltage can be rapidly lowered due to the parasitic capacitor that exists between the gate electrode 26 and the drain electrode 56. The amount of undesired voltage distortion is sometimes called a kickback voltage. The kickback voltage amount, $\Delta V_p$ may be obtained by the following Equation 1.

$$\Delta V_p = \Delta V_g \times C_{gd}/(C_{st}+C_{lc}+C_{gd}) \quad \text{(Equation 1)}$$

Here, $\Delta V_g$ means a variation of a gate-on voltage and gate-off voltage (i.e., Vg on −Vg off), $C_{gd}$ means a parasitic capacitance of the parasitic capacitor that is formed between the gate electrode 26 and the drain electrode 56, $C_{st}$ means a storage capacitance of the storage capacitor that is formed between the storage electrode and the pixel electrode 72, and $C_{lc}$ means a liquid crystal capacitance of the liquid crystal capacitor that is formed in the liquid crystal between the pixel electrode 72 and the common electrode of the common electrode substrate.

The size of the above-described kickback voltage is a function of the parasitic capacitance $C_{gd}$ and the latter can be a variable across the substrate when mask misalignment occurs. The parasitic capacitance $C_{gd}$ is determined by the overlapping area between the gate electrode 26 and the drain electrode 56.

Referring to FIG. 3B, even in the case where the gate electrode 26 is misaligned due to the mask misalignment to thereby form a gate electrode 26_1 instead of gate 26, where the displaced gate electrode 26_1 is misaligned downward, an increase amount, a, in one overlapping area and a decrease amount, b, in a second overlapping area between the drain electrode 56 and the misaligned gate electrode 26_1 are the same, and thus the parasitic capacitance $C_{gd}$ remains substantially constant. Therefore, the kickback voltage amount $\Delta V_p$ becomes substantially constant in terms of its dependence on the Miller capacitance ($C_{gd}$). As a result, this compensation prevents a noticeable flicker from occurring on the screen when the image is changed across a relatively wide area.

Referring to FIGS. 1 and 2B, a passivation layer 60 is formed on the data wiring lines 52a, 52b, 55a, 55b, 56, 58a, and 58b, and the active layer 40 that is exposed through the data wiring lines 52a, 52b, 55a, 55b, 56, 58a, and 58b.

The passivation layer 60 may be formed of an inorganic material, such as silicon nitride (SiNx) or silicon oxide (SiOx), an a-Si:C:O layer or an a-Si:O:F layer (a CVD layer having a low dielectric constant), which is deposited by a PECVD (plasma enhanced chemical vapor deposition) method, an acryl-based organic insulating material, which has an excellent planarization characteristic and photosensitivity, or the like.

The contact hole 66 is formed in the passivation layer 60 so that the drain electrode 56 is exposed. The contact hole 66 may have corners or various circular shapes, and has the width that is extended so as to be connected to the pixel electrode 72.

The pixel electrode 72 that is electrically connected to the drain electrode 56 through the contact hole 66 and is located in a pixel region is formed on the passivation layer 60. Here, the pixel electrode 72 may be formed of a transparent conductor, such as an ITO (Indium Tin Oxide) or IZO (Indium Zinc Oxide), or a reflective conductor, such as aluminum.

The pixel electrode 72 may only be disposed inside a space formed by the first data line 52a and the second data line 52b, and the gate line 22. However, different from what has been described, the pixel electrode 72 may partially overlap the first data line 52a and the second data line 52b, and the gate line 22, such that an aperture ratio can be increased.

According to the thin film transistor substrate of this exemplary embodiment, even though mask misalignment occurs, the overlapping area of the gate electrode 26 and the drain electrode 56 remains substantially the same as the overlapping area when the misalignment does not occur. Therefore, the parasitic Miller capacitance is substantially constant, and thus the image quality is improved relative to a display where Miller capacitance varies as a function of mask misalignment. In addition, since two of the first data line 52a and the second data line 52b and two of the first source electrode 55a and the second source electrode 55b are deposed in one pixel, even though any one of them, for example, the second data line 52b or the second source electrode 55b is disconnected, a desired functioning of the pixel area can be maintained.

Figure 4:
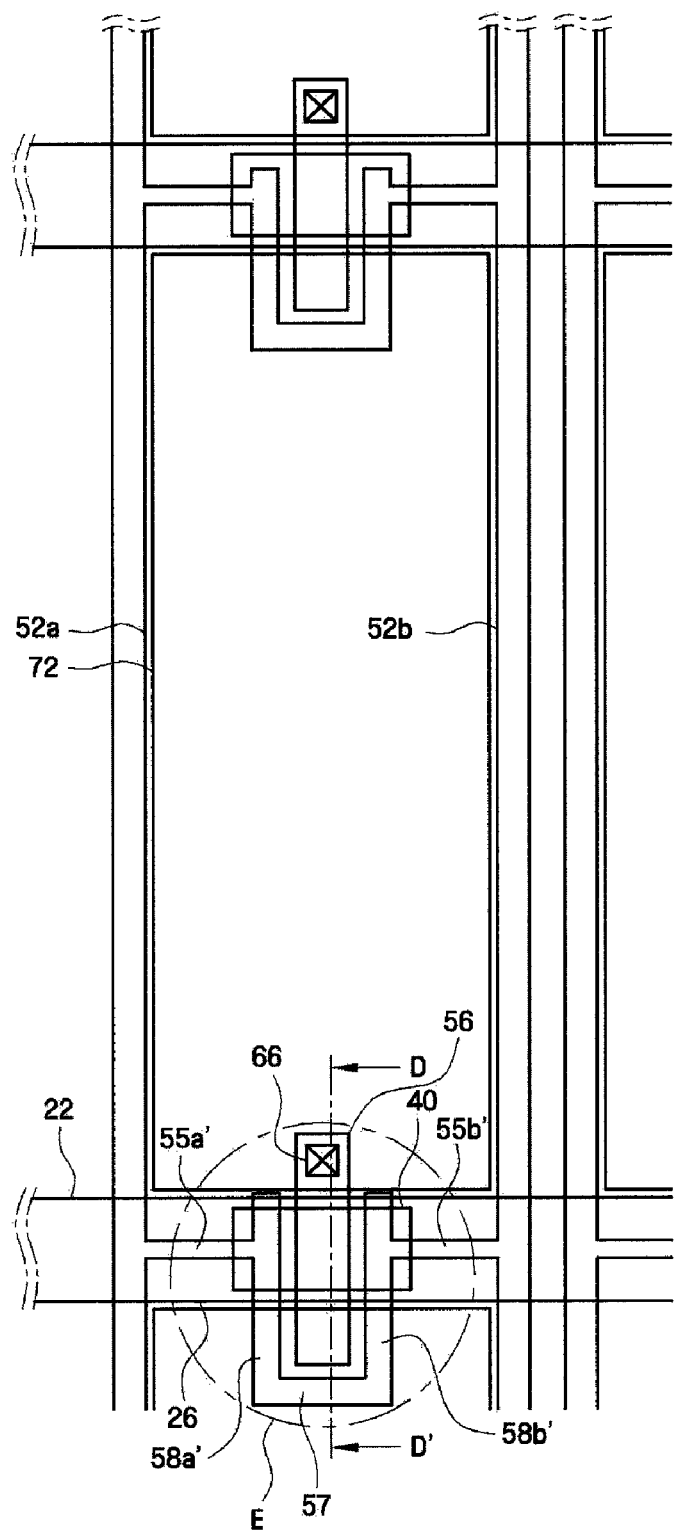
FIG. 4 is a layout view of a thin film transistor substrate according to a second exemplary embodiment.
Figure 5:
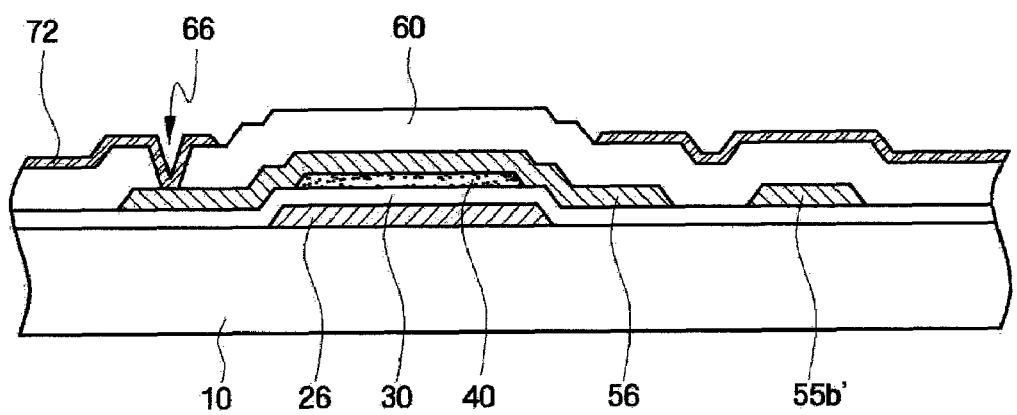
FIG. 5 is a cross-sectional view of the thin film transistor substrate of FIG. 4 taken along the line D-D'.
Figure 6A:
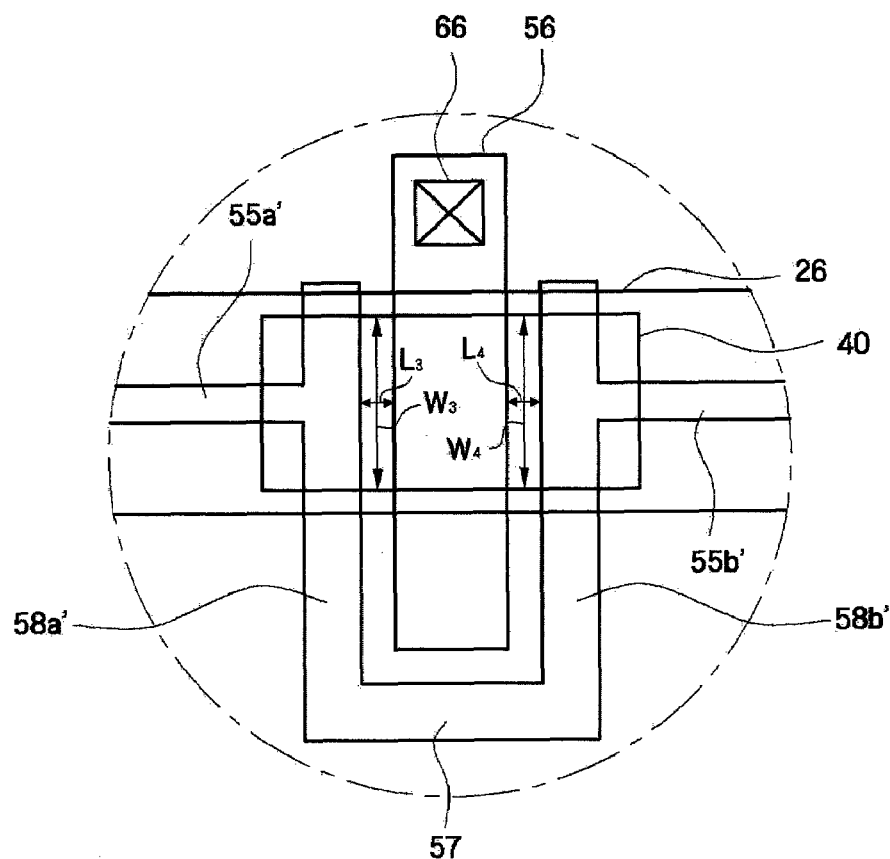
FIG. 6A is an enlarged view illustrating a portion "E" of FIG. 4.
Figure 6B:
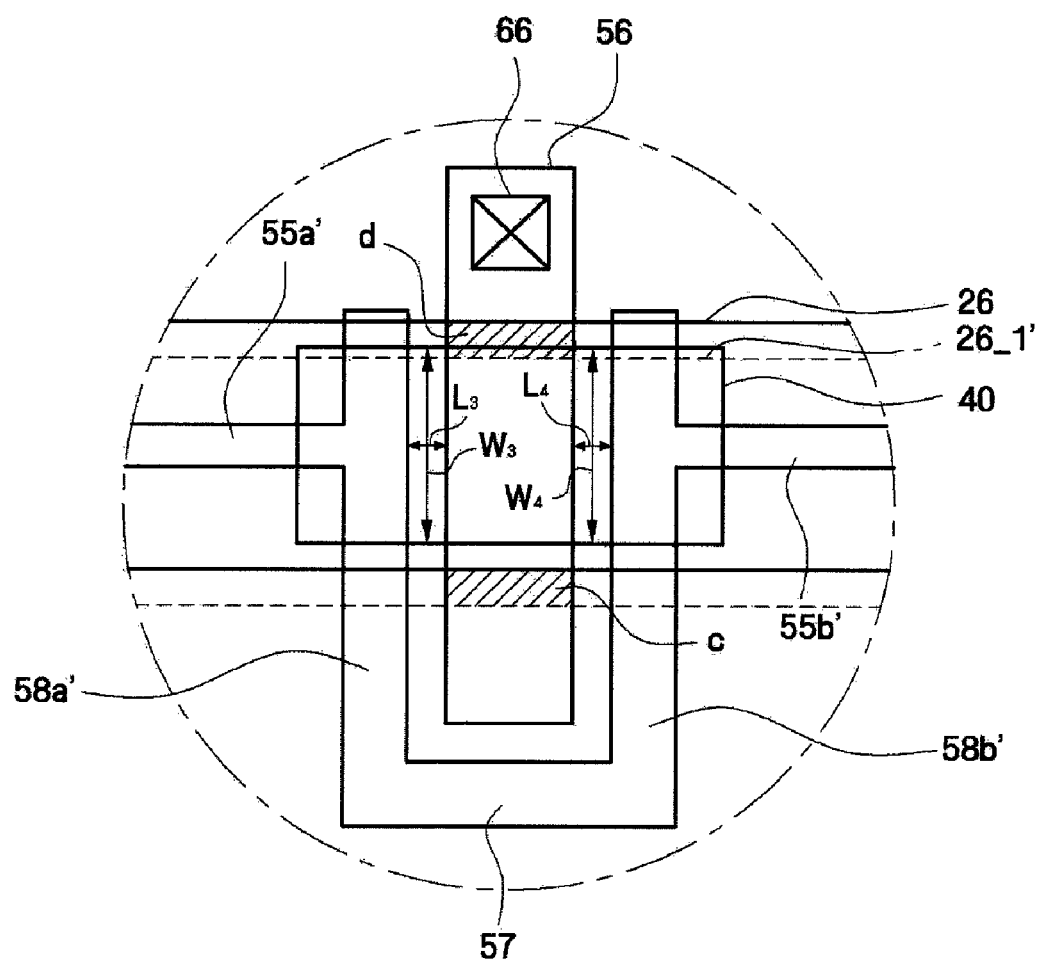
FIG. 6B is an enlarged view illustrating a portion "E" of FIG. 4 when mask misalignment occurs.

Hereinafter, referring to FIGS. 4 to 6B, a thin film transistor substrate according to a second exemplary embodiment will be described. FIG. 4 is a layout view of a thin film transistor substrate according to a second exemplary embodiment of the present invention. FIG. 5 is a cross-sectional view of the thin film transistor substrate of FIG. 4 taken along the line D-D'. FIG. 6A is an enlarged view illustrating a portion "E" of FIG. 4. FIG. 6B is an enlarged view illustrating a portion "E" of FIG. 4 when mask misalignment occurs.

For the convenience of explanation, like reference numerals refer to like elements that have the same functions as those in the drawings of the first exemplary embodiment. Therefore, descriptions thereof will be omitted or simplified. As shown in FIGS. 4 to 6B, a thin film transistor substrate 100' according to this exemplary embodiment has basically the same structure as the thin film transistor substrate 100 according to the first exemplary embodiment except for the following. That is, in the thin film transistor substrate 100' according to this exemplary embodiment, a first source electrode 55a' and a second source electrode 55b' that are formed in one pixel are electrically connected locally to each other by a source electrode connecting part 57.

Referring to FIGS. 4 to 6A, an end of the first source electrode 55a' and an end of the second source electrode 55b' extend outside a gate electrode 26, and are electrically connected to each other by the source electrode connecting part 57.

The end of the first source electrode 55a' and the end of the second source electrode 55b' include parallel portions 58a' and 58b', respectively, which are in parallel to the drain electrode 56. The parallel portions 58a' and 58b' are electrically connected to each other by the source electrode connecting part 57.

Each of the parallel portions 58a' and 58b' has a length larger than the width of the gate electrode 26 so as to completely cover the width of the gate electrode 26 that is disposed in a horizontal direction. That is, the parallel portions 58a' and 58b' protrude toward both sides of the gate electrode 26 in a widthwise direction. Therefore, even though the up and down direction of the gate electrode 26 may vary between pixels due to the mask misalignment, the channel widths $W_3$ and $W_4$ of the thin film transistor are constant.

The source electrode connecting part 57 connects the ends of the parallel portions 58a' and 58b' to each other. At least a portion of the source electrode connecting part 57 is disposed not to overlap the gate electrode 26. Therefore, the channel widths $W_3$ and $W_4$ that correspond to the parallel portions 58a' and 58b' of the first source electrode 55a' and the second source electrode 55b' do not increase excessively. Further, the source electrode connecting part 57 is disposed not to be in contact with an end of the drain electrode 56, such that the first source electrode 55a' and the second source electrode 55b' are not directly electrically connected to the drain electrode 56. Specifically, the first source electrode 55a', the source electrode connecting part 57, and the second source electrode 55b' are formed to surround one side of the drain electrode 56, that is, the drain electrode 56 at an opposite side to a contact hole 66, and thus they may be U-shaped.

The source electrode connecting part 57 has the same material as the first source electrode 55a' and the second source electrode 55b', and is formed on the same layer as the first source electrode 55a' and the second source electrode 55b'.

As the ends of the first source electrode 55a' and the second source electrode 55b' are electrically connected to each other, even when one of the one pair of first data line 52a and the second data line 52b that are disposed in one pixel is disconnected, a data voltage can be applied to the first source electrode 55a' and the second source electrode 55b' through the other, for example, the first data line 52a.

The channel widths $W_3$ and $W_4$ that correspond to the widths of the first source electrode 55a' and the second source electrode 55b' are formed on the active layer 40. Further, the channel lengths L3 and L4 that correspond to distances at which the first source electrode 55a' and the second source electrode 55b' are respectively separated from the drain electrode 56 are formed on the active layer 40.

As the ends of the first source electrode 55a' and the second source electrode 55b' are electrically connected to each other by the source electrode connecting part 57, even when one of the one pair of first data line 52a and second data line 52b is disconnected, the channel widths $W_3$ and $W_4$ formed on the active layer 40 are the same as those before the disconnection, and the same amount of current may flow.

Referring to FIG. 6B, even when the position of the gate electrode 26 in the up and down direction may vary between the pixels due to mask misalignment, in particular, the mask misalignment in the up an down direction, the overlapping area between the gate electrode 26 and the drain electrode 56 is constant, and thus a parasitic capacitance is constant. That is, even when a gate electrode 26_1' that is misaligned is formed, an increase amount, c, in the overlapping area and a decrease d in the overlapping area between the drain electrode 56 and the misaligned gate electrode 26_1' are the same, such that the parasitic capacitance is constant. Therefore, a kickback voltage remains substantially constant, and an optimum common voltage value of each portion of the liquid crystal panel becomes constant, which prevents a flicker from occurring on the screen.

Figure 7:
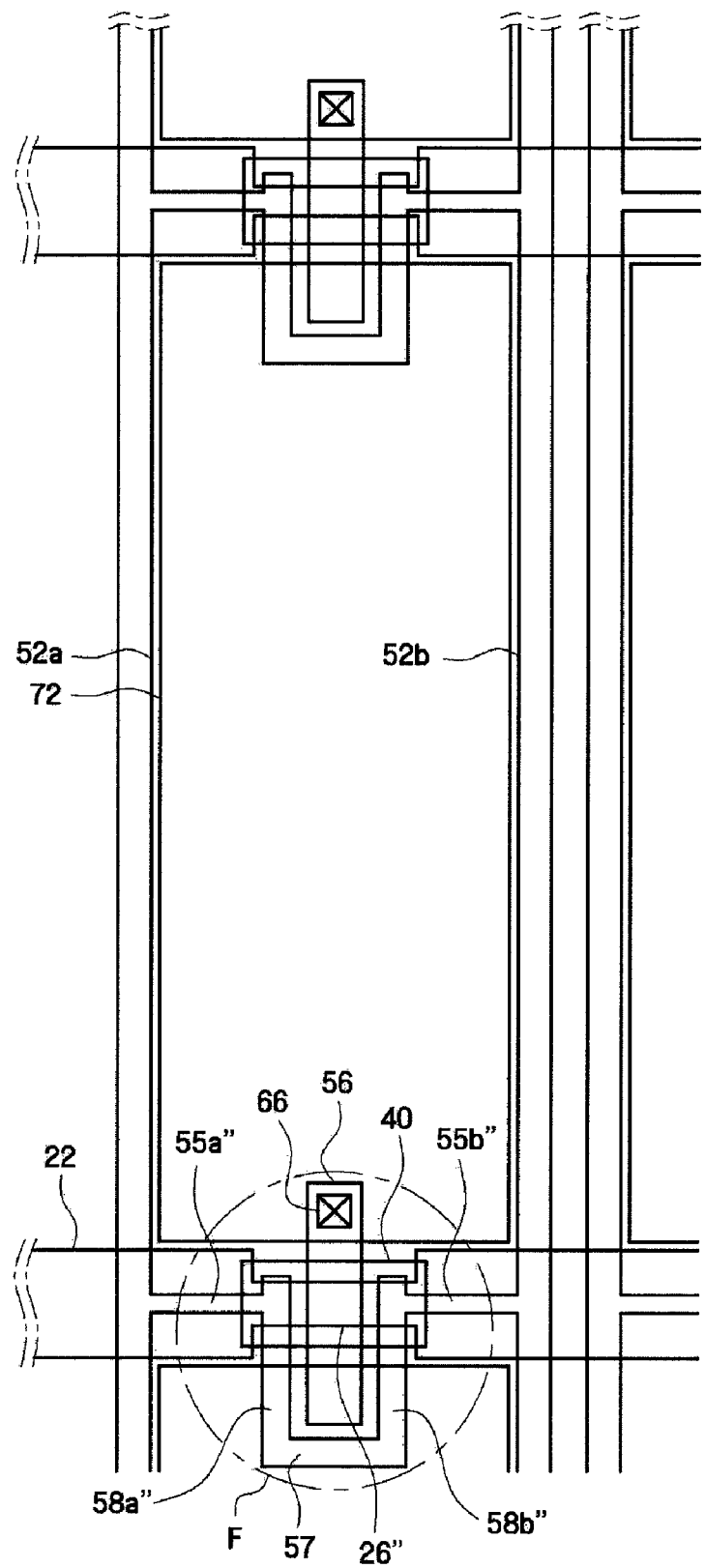
FIG. 7 is a layout view of a thin film transistor substrate according to a third exemplary embodiment.
Figure 8A:
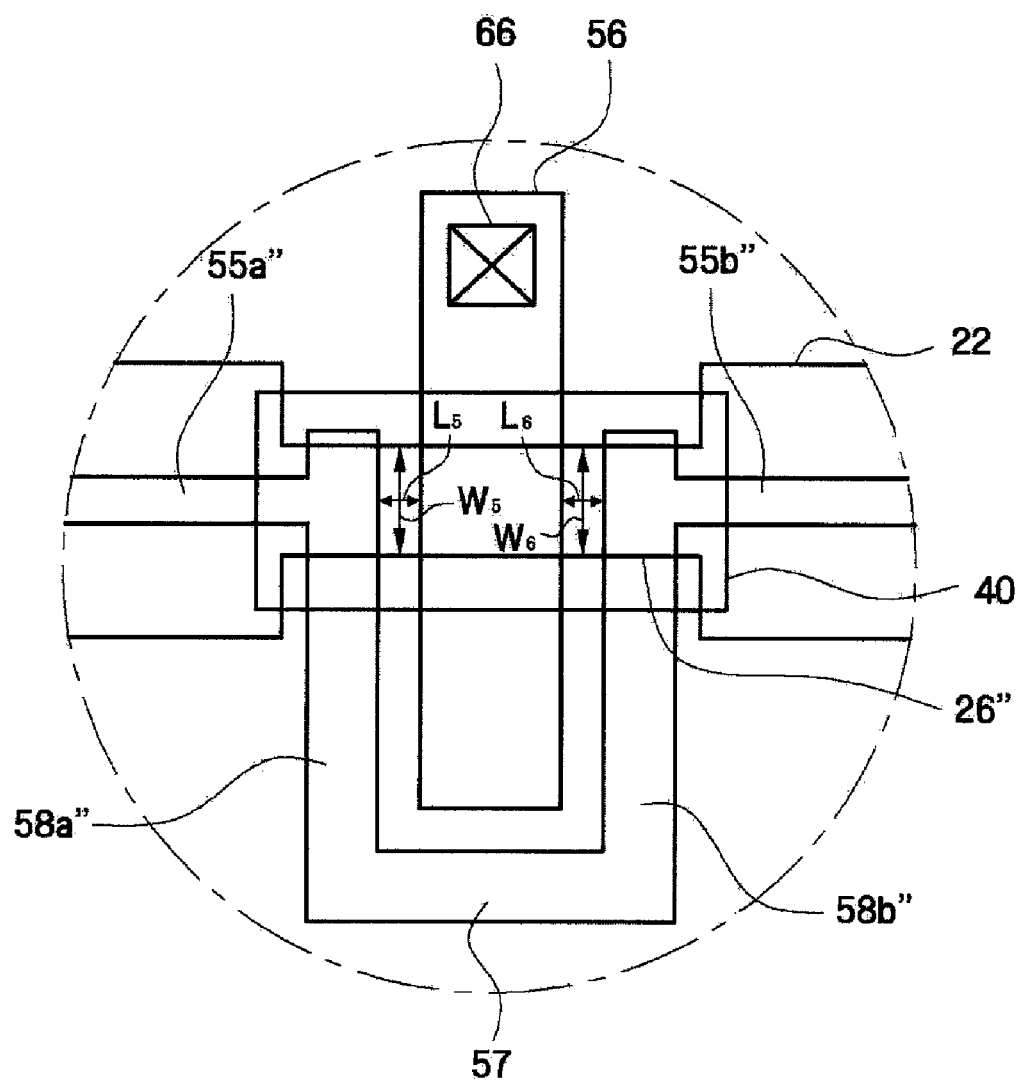
FIG. 8A is an enlarged view illustrating a portion "F" of FIG. 7.
Figure 8B:
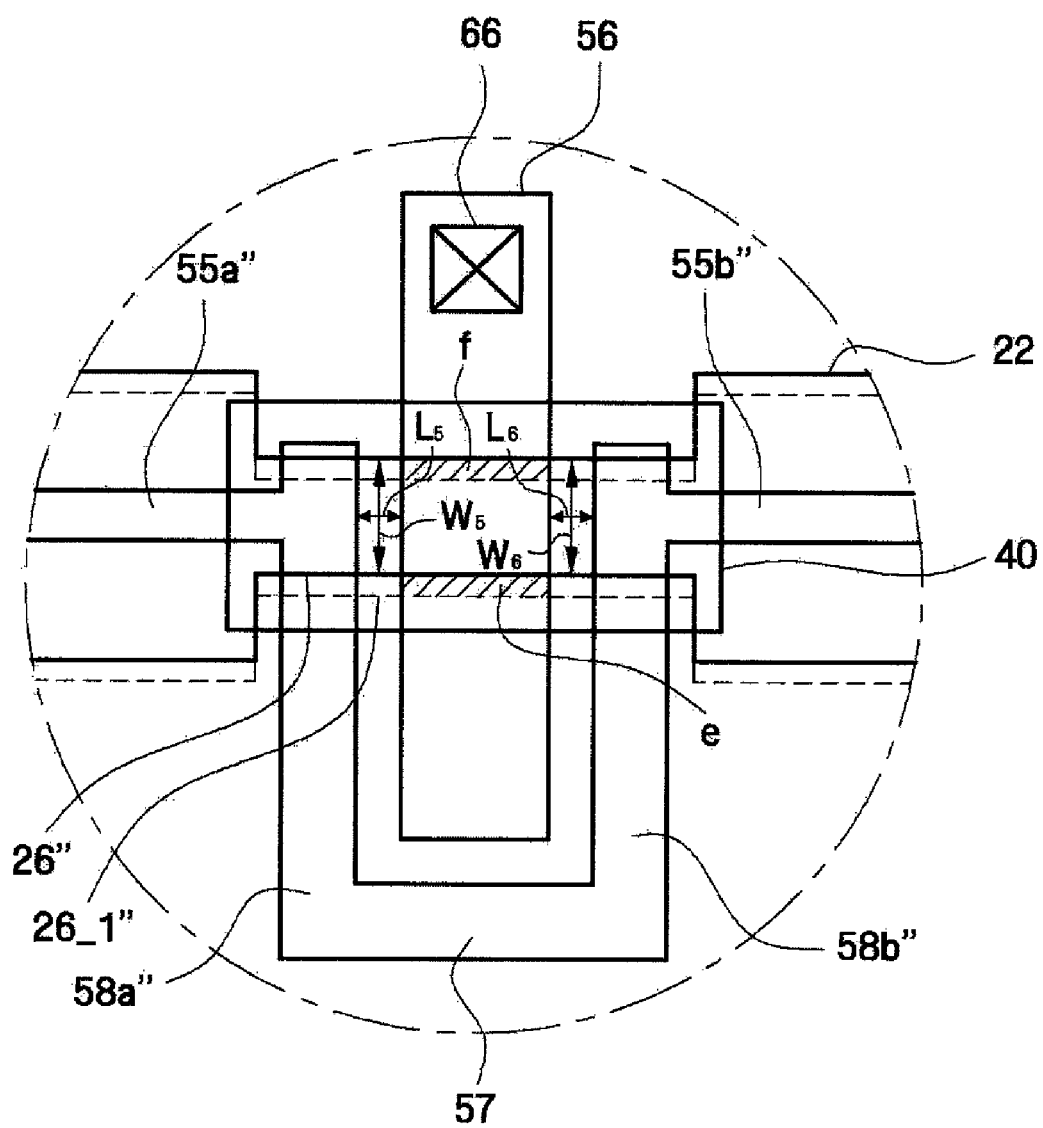
FIG. 8B is an enlarged view illustrating a portion "F" of FIG. 7 when mask misalignment occurs.

Hereinafter, referring to FIGS. 7 to 8B, a thin film transistor substrate according to a third exemplary embodiment will be described. FIG. 7 is a layout view of a thin film transistor substrate according to a third exemplary embodiment. FIG. 8A is an enlarged view illustrating a portion "F" of FIG. 7. FIG. 8B is an enlarged view illustrating a portion "F" of FIG. 7 when mask misalignment occurs. For the convenience of explanation, like reference numerals refer to like elements that have the same functions as those in the drawings of the first and second exemplary embodiments. Therefore, descriptions thereof will be omitted or simplified.

As shown in FIGS. 7 and 8A, a thin film transistor substrate 100" according to this exemplary embodiment has a gate electrode 26" that overlaps a drain electrode 56, and ends of a first source electrode 55a" and a second source electrode 55b". Here, the gate electrode 26" has a width that is smaller than the general width of its gate line 22.

The gate electrode 26" of this exemplary embodiment is a portion of the gate line 22, and has the width smaller than the gate line 22, such that the gate electrode 26" can reduce the channel widths $W_5$ and $W_6$ of the thin film transistor. Therefore, since the first source electrode 55a" and the second source electrode 55b" are electrically connected to each other by a source electrode connecting part 57, it is possible to prevent values of the channel widths $W_5$ and $W_6$ with respect to the channel lengths $L_5$ and $L_6$ from becoming larger than desired values.

The drain electrode 56, and the first source electrode 55a" and the second source electrode 55b" overlap each other with the gate electrode 26" having the smaller width, and an active layer 40 interposed therebetween.

Like the first and second exemplary embodiments, the end of the first source electrode 55a" and the end of the second source electrode 55b" include parallel portions 58a" and 58b", respectively, which are in parallel to the drain electrode 56. The parallel portions 58a'' and 58b'' are electrically connected to each other by the source electrode connecting part 57.

Each of the parallel portions 58a'' and 58b'' has the length that is larger than the width of the gate electrode 26'' so as to almost completely cover the width of the gate electrode 26'' that is disposed in a horizontal direction. That is, the parallel portions 58a'' and 58b'' protrude toward both sides of the gate electrode 26'' in a widthwise direction. Therefore, even when the up and down position of the gate electrode 26'' may vary between pixels due to mask misalignment, the effective channel widths $W_5$ and $W_6$ remain substantially constant. The lengths of the parallel portions 58a'' and 58b'' are determined in consideration of the channel widths $W_5$ and $W_6$ of the thin film transistor and an aperture ratio.

Referring to FIG. 8B, as described in the first and second exemplary embodiments, the drain electrode 56 overlaps the gate electrode 26'' such that the drain electrode 56 is substantially perpendicular to the gate electrode 26''. Even when a gate electrode 26_1'' that is misaligned due to the mask misalignment is generated, an increase e in the overlapping area and a decrease f in the overlapping area of the misaligned gate electrode 26_1'' and the drain electrode 56 are the same, such that a parasitic capacitance become constant. Therefore, a kickback voltage remains substantially constant, and an optimum common voltage value of each portion of the liquid crystal panel becomes constant, which prevents a flicker from occurring on the screen.

On the active layer 40, the channel widths $W_5$ and $W_6$ that correspond to the widths of the first source electrode 55a'' and the second source electrode 55b'' are formed, and the channel lengths $L_5$ and $L_6$ that correspond to distances at which the first source electrode 55a'' and the second source electrode 55b'' are respectively separated from the drain electrode 56 are formed. Values of the channel widths $W_5$ and $W_6$ with respect to the channel lengths $L_5$ and $L_6$ are smaller than those in the second exemplary embodiment. It is possible to optimize the values of the channel widths $W_5$ and $W_6$ with respect to the channel lengths $L_5$ and $L_6$ by adjusting the width of the gate electrode 26''.

According to the arrangement of the thin film transistor of this exemplary embodiment and first and second exemplary embodiments, even when the gate electrode 26'' is misaligned due to mask misalignment to thereby form a gate electrode 26_1'' that is misaligned downward, an increase e in the overlapping area and a decrease f in the overlapping area of the misaligned gate electrode 26_1'' and the drain electrode 56 are the same. Therefore, the parasitic capacitance is also constant. Accordingly, the kickback voltage becomes constant, and an optimum common voltage value of each portion of the liquid crystal panel becomes constant, which prevents a flicker from occurring on the screen. Further, since ends of the first source electrode 55a'' and the second source electrode 55b'' are electrically connected to each other, even when one pair of the first data line 52a and the second data line 52b are disconnected, the same amount of current can be transmitted to the drain electrode 56 through the first source electrode 55a'' and the second source electrode 55b''. In addition, the amount of current that flows from the first source electrode 55a'' and the second source electrode 55b'' toward the drain electrode 56 may have a maximum value.

Although a number of exemplary embodiments have been described, it will be apparent to those skilled in the art in view of the above that various modifications and changes may be made thereto without departing from the scope and spirit of the disclosure. Therefore, it should be understood that the above exemplary embodiments are not limiting, but rather illustrative.

As described above, according to the exemplary embodiments, at least one of the following effects may be obtained.

First, since in one embodiment, the drain electrode is disposed to be substantially perpendicular to the gate electrode and elongated so as to completely cover the width of the gate line and at least slightly beyond, even when the mask misalignment occurs, the value of the parasitic capacitance formed between the gate and drain remains substantially constant.

Second, since in one embodiment, two data lines and two source electrodes are arranged in one pixel area, that is, the first data line and the second data line, and the first source electrode and the second source electrode are arranged in one pixel, a function of the pixels can be maintained even when any one of the data lines is disconnected due to a manufacturing defect.

Third, it is possible to increase or reduce the amount of current that passes through the thin film transistor by adjusting the overlapping areas among the gate electrode, the active layer, the drain electrode, and the first source electrode, and the second source electrode while still providing compensation for manufacturing misalignment.

What is claimed is:

1. A thin film transistor substrate comprising:
   an insulating substrate;
   gate lines, each of which is formed on the insulating substrate and comprises a gate electrode;
   an active layer formed on the gate electrodes so as to overlap the gate electrodes;
   first and second data lines, each of which crosses the gate lines while being insulated from the gate lines;
   first and second source electrodes branched from the first and second data lines, respectively, and overlapping the active layer; and
   drain electrodes, each of which is located between the first source electrode and the second source electrode, and is formed on the gate electrode so as to have a length larger than the overlapping width of the gate electrode, wherein, the first and second data lines transmit data signals from an external circuit to the first source electrode and the second source electrode, respectively.

2. The thin film transistor substrate of claim 1, wherein the first source electrode and the second source electrode are separated from each other.

3. The thin film transistor substrate of claim 2, wherein an end of the first source electrode and an end of the second source electrode respectively comprise parallel portions which are in parallel to the drain electrode.

4. The thin film transistor substrate of claim 3, wherein the first source electrode and the second source electrode are completely overlapped by the gate electrode.

5. The thin film transistor substrate of claim 3, wherein the first source electrode and the second source electrode are each T-shaped.

6. The thin film transistor substrate of claim 1, wherein the drain electrode extends longitudinally at substantially right angles to the longitudinal direction of the gate line.

7. The thin film transistor substrate of claim 6, wherein the drain electrode has an elongated bar shape.

8. The thin film transistor substrate of claim 1, wherein a same data voltage is applied to the first data line and the second data line.

9. The thin film transistor substrate of claim 1, wherein the insulating substrate is a plastic substrate.

10. The thin film transistor substrate of claim 1, wherein the active layer is formed of an organic material.

11. The thin film transistor substrate of claim 1, wherein the first source electrode and the second source electrode are electrically connected locally to each other by a source electrode connecting part.

12. The thin film transistor substrate of claim 11, wherein the source electrode connecting part has at least a portion that does not overlap the gate electrode.

13. The thin film transistor substrate of claim 11, wherein the source electrode connecting part is formed on the same layer as the first source electrode and the second source electrode using the same material as the first source electrode and the second source electrode.

14. The thin film transistor substrate of claim 11, wherein:

an end of the first source electrode and an end of the second source electrode respectively comprise parallel portions which are in parallel to the drain electrode, and the parallel portions are electrically connected locally to each other by the source electrode connecting part.

15. The thin film transistor substrate of claim 14, wherein each of the parallel portions has a length that is larger than the width of the gate electrode.

16. The thin film transistor substrate of claim 14, wherein the first source electrode and the second source electrode are each T-shaped.

17. The thin film transistor substrate of claim 11, wherein the gate electrode is a portion of the gate line, and has a width smaller than the normal width of the gate line.

18. The thin film transistor substrate of claim 17, wherein:

the end of the first source electrode and the end of the second source electrode respectively comprise parallel portions which are in parallel to the drain electrode, and the parallel portions are electrically connected to each other by the source electrode connecting part.

19. The thin film transistor substrate of claim 18, wherein each of the parallel portions has the length that is larger than the width of the gate electrode.

20. A thin film transistor substrate comprising:

an insulating substrate formed of plastic;

gate lines, each of which is formed on the insulating substrate and comprises or connects to a gate electrode;

an active layer formed on the gate electrodes so as to overlap the gate electrodes, and made of an organic material;

first and second data lines, each of which crosses the gate line while being insulated from the gate line;

first and second source electrodes branched from the first and second data lines and overlapping the active layer; and drain electrodes, each of which is located between the first source electrode and the second source electrode, and is formed on the gate electrode so as to have a length larger than the overlapping width of the gate electrode so as to maintain a constant overlap area even if the gate electrode hypothetically shifts along the longitudinal direction of the drain electrode, and is substantially perpendicular to the gate line, wherein, the first and second data lines transmit data signals from an external circuit to the first source electrode and the second source electrode, respectively.

* * * * *